(12) United States Patent
Kawakita et al.

(10) Patent No.: US 7,281,325 B2
(45) Date of Patent: Oct. 16, 2007

(54) METHOD OF MANUFACTURING CIRCUIT BOARD

(75) Inventors: Yoshihiro Kawakita, Osaka (JP); Toshiaki Takenaka, Kyoto (JP); Tadashi Tojyo, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 276 days.

(21) Appl. No.: 10/535,158

(22) PCT Filed: Nov. 30, 2004

(86) PCT No.: PCT/JP2004/017743

§ 371 (c)(1),
(2), (4) Date: May 16, 2005

(87) PCT Pub. No.: WO2005/057997

PCT Pub. Date: Jun. 23, 2005

(65) Prior Publication Data

US 2006/0064871 A1    Mar. 30, 2006

(30) Foreign Application Priority Data

Dec. 10, 2003    (JP) .............................. 2003-411456

(51) Int. Cl.
*H01K 3/10* (2006.01)

(52) U.S. Cl. .............................. 29/852; 29/825; 29/830; 29/846

(58) Field of Classification Search ................. 29/825, 29/830, 846, 852
See application file for complete search history.

(56) References Cited

U.S. PATENT DOCUMENTS

| | | | | | |
|---|---|---|---|---|---|
| 3,990,926 | A | * | 11/1976 | Konicek ...................... | 216/20 |
| 4,715,116 | A | * | 12/1987 | Thorpe et al. ................ | 29/846 |
| 5,527,998 | A | * | 6/1996 | Anderson et al. ........... | 174/255 |
| 5,617,629 | A | * | 4/1997 | Ekstrom ....................... | 29/846 |
| 5,800,650 | A | * | 9/1998 | Anderson et al. ........... | 156/150 |
| 6,163,957 | A | * | 12/2000 | Jiang et al. ................... | 29/852 |
| 6,183,880 | B1 | * | 2/2001 | Yoshioka et al. ........... | 428/607 |
| 7,181,839 | B2 | * | 2/2007 | Takenaka et al. ............. | 29/852 |
| 2001/0029666 | A1 | * | 10/2001 | Nakamura et al. ............ | 29/846 |

FOREIGN PATENT DOCUMENTS

| | | |
|---|---|---|
| JP | 11-026902 | 1/1999 |
| JP | 11-238958 | 8/1999 |
| JP | 2002-067061 | 3/2002 |
| JP | 2003/158366 | 5/2003 |
| JP | 2003-179356 | 6/2003 |
| JP | 2003-213017 | 7/2003 |
| JP | 2004-221236 | 8/2004 |
| JP | 2004-221237 | 8/2004 |

* cited by examiner

Primary Examiner—Carl J. Arbes
(74) Attorney, Agent, or Firm—Wenderoth, Lind & Ponack, L.L.P.

(57) ABSTRACT

A pre-preg sheet includes a substrate and a resin impregnated in the substrate. A first metal foil is placed on the pre-preg sheet to provide a laminated body. The laminated body is put in a heating device having a temperature maintained at a temperature close to a softening temperature of the resin. The laminated body is compressed at the temperature at a predetermined pressure. The first metal foil is bonded to the pre-preg sheet of the laminated body and hardening the resin, thus providing a circuit board. This method provides a stable resistance of a conductive paste filing a through-hole in the pre-preg sheet to be compressed at a small rate.

15 Claims, 7 Drawing Sheets

METHOD OF MANUFACTURING CIRCUIT BOARD

DESCRIPTION

Technical Field

The present invention relates to a method of manufacturing a circuit board having circuit patterns on both surfaces.

BACKGROUND OF THE INVENTION

As electronic instruments have recently been small and had high densities, multi-layer circuit boards have been required not only in industrial instruments but also in consumer instruments.

Such circuit boards require a method of interconnecting circuit patterns on plural layers through an inner via-hole and a highly-reliable structure. Japanese Patent Laid-Open Publication No.6-268345 discloses a conventional method of manufacturing a multi-layer circuit board having an inner via-hole made of conductive paste. The conventional method of manufacturing a circuit board having four layers will be described.

First, a method of manufacturing a double-sided circuit board used as a substrate of the multi-layer circuit board will be described. FIG. 6A to FIG. 6G are sectional views showing processes of the conventional method of manufacturing the double-sided circuit board.

Pre-preg sheet 101, a substrate, is made of a composite material including a core and thermosetting epoxy resin impregnated in the core. The core is made of non-woven fabric, such as aromatic polyamide fiber, and has a thickness t101 of 150 μm compressed at a compression rate of about 35%. Pre-preg sheet 101 employs a porous material having vacancy for obtaining a compressive property.

FIG. 6A shows pre-preg sheet 101 having both surfaces onto which releasing films 102a and 102b are bonded, respectively. Respective surfaces of releasing films 102a and 102b are coated with Si-based releasing agent. The films are made of film, such as polyethylene terephthalate film. Through-hole 103 is formed in predetermined positions of pre-preg sheet 101 by a laser machining method, as shown in FIG. 6B. Through-hole 103 are filled with conductive paste 104 by a printing method, as shown in FIG. 6C.

Then, releasing films 102a and 102b are peeled off from the surfaces of pre-preg sheet 101, as shown in FIG. 6D. Metal foils 105a and 105b are placed on the surfaces of pre-preg sheet 101, and are heated and pressurized by hot press, as shown in FIG. 6E. Thus, thickness t102 of pre-preg sheet 101 is reduced to about 100 μm, and pre-preg sheet 101 is bonded to metal foils 105a and 105b, as shown in FIG. 6F. Metal foils 105a and 105b are electrically connected via conductive paste 104 filling through-hole 103.

Metal foils 105a and 105b is selectively etched to form circuit patterns 106a and 106b, thus providing a double-sided circuit board shown in FIG. 6G.

FIG. 7A to FIG. 7D are sectional views showing the conventional method of manufacturing a multi-layer circuit board having four layers as will be described below.

First, as shown in FIG. 7A, double-sided circuit board 110 having circuit patterns 106a and 106b is prepared, and pre-preg sheets 101a and 101b having through-holes 103 filled with conductive paste 104 are prepared. Double-sided circuit board 110 is manufactured by the processes shown in FIG. 6A to FIG. 6G, and pre-preg sheets 101a and 101b are manufactured by the processes shown in FIG. 6A to FIG. 6D.

Then, metal foil 105b, pre-preg sheet 101b, double-sided circuit board 110, pre-preg sheet 101a, and metal foil 105a are positioned and stacked in this order on a laminated plate (not shown), as shown in FIG. 7B.

Then, metal foil 105b, pre-preg sheet 101b, double-sided circuit board 110, pre-preg sheet 101a, and metal foil 105a are heated and pressurized by hot press. Thus, as shown in FIG. 7C, pre-preg sheets 101a and 101b are compressed to have thickness t102, and are bonded to double-sided circuit board 110 and metal foils 105a and 105b. Circuit patterns 106a and 106b are electrically connected to metal foils 105a and 105b via conductive paste 104, respectively.

As shown in FIG. 7D, metal foils 105a and 105b are selectively etched to form circuit patterns 106a and 106b, thus providing four-layer circuit board 120.

A multi-layer circuit board having more than four layers, such as a six-layer circuit board, is obtained by repeating the processes shown in FIG. 7A to FIG. 7D using four-layer circuit board 120 obtained by the processes of FIG. 7A to FIG. 7D instead of double-sided circuit board 110.

In the case that the through-hole has a small diameter and is arranged adjacent to another through-hole by a small pitch for providing a fine circuit board, the conventional method of manufacturing the circuit board has the following problem.

The pre-preg sheet made of porous material has a vacancy to be compressed. When the volume ratio of the vacancy to the pre-preg sheet is large, a portion of the conductive paste intends to be put into the vacancy. The resistance of the conductive paste in the hole accordingly increases, and electrical insulation between the conductive pastes in the adjacent through-hole may be hardly obtained. Therefore, a material having small porosity may preferably used, but the material having the small porosity cannot be compressed at a high compressed rate.

FIG. 8A and FIG. 8B are sectional views of the circuit board formed by the conventional method.

FIG. 8A shows pre-preg sheet 101 having a compression rate of 35%. In FIG. 8A, pre-preg sheet 101 is sufficiently compressed before resin impregnated into pre-preg sheet 101 flows in surface direction D101, so that conductive paste 104 does not flow out of through-hole 103 and has a stable resistance.

In FIG. 8B, pre-preg sheet 101 has a high porosity and a small compressed rate, e.g. smaller than 10%. A compression rate of conductive paste 104 decreases during heating and pressurizing, and conductive paste 104 may flow as denoted by flow 115. A contacting force between conductive particles in conductive paste 104 accordingly decreases.

When the resin in pre-preg sheet 101 melts due to the heating and pressurizing and flows in surface direction D101, conductive paste 104 flows out of through-hole 103. The contacting force between the conductive particles in conductive paste 104 accordingly decreases thus increasing the resistance of a portion of conductive paste 104 in through-hole 103. Then, the connection resistance between metal foils 105a and 105b accordingly increases, thus causing a quality of the circuit board to decline.

In order to solve this problem, the metal foil and a pre-preg sheet having a core and a resin impregnated into the core are stacked, and they are then heated for a predetermined time at a first temperature close to a softening temperature of the resin while being pressurized by a predetermined pressure, and then heated for a predetermined time at a second temperature higher than the first temperature and pressurized.

In this method, the processes at the first temperature to the second temperature are executed continuously, so that the rate of a temperature rise during the processes is restricted. Specifically, when the first temperature varies to the second temperature, the rate of the temperature rise at a temperature at which the resin in the pre-preg sheet melts and flows may be reduced due to a delay of heat conduction through an intermediate material, such as a cushioning material or a SUS plate. The rate of the temperature rise may not reach a predetermined rate. In other words, fluidiity of the resin during molding is not sufficiently secured, so that the pre-preg sheet can hardly be molded especially when the viscosity of the melting resin is high.

SUMMARY OF THE INVENTION

A pre-preg sheet including a substrate and a resin impregnated in the substrate is provided. A first metal foil is placed on the pre-preg sheet to provide a laminated body. The laminated body is put in a heating device having a temperature maintained at a temperature close to a softening temperature of the resin. The laminated body is compressed at the temperature at a predetermined pressure. The first metal foil is bonded to the pre-preg sheet of the laminated body and hardening the resin, thus providing a circuit board.

This method provides a stable resistance of a conductive paste filling a through-hole in the pre-preg sheet to be compressed at a small rate.

Figure 1A:
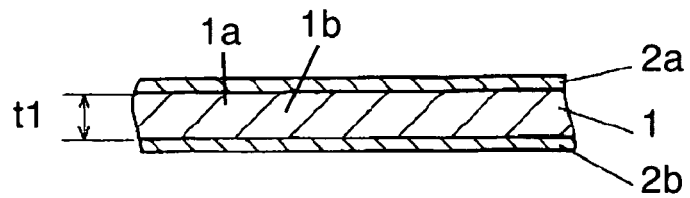
FIG. 1A is a sectional view of a double-sided circuit board for showing a method of manufacturing the board in accordance with an exemplary embodiment of the present invention.
Figure 1B:
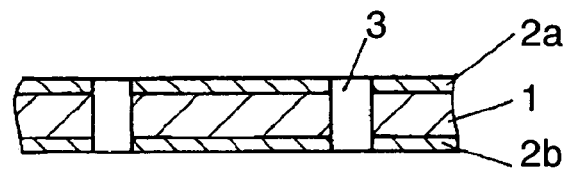
FIG. 1B is a sectional view of the double-sided circuit board for showing the method of manufacturing the board in accordance with the embodiment.
Figure 1C:
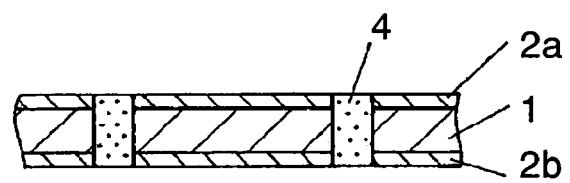
FIG. 1C is a sectional view of the double-sided circuit board for showing the method of manufacturing the board in accordance with the embodiment.
Figure 1D:
FIG. 1D is a sectional view of the double-sided circuit board for showing the method of manufacturing the board in accordance with the embodiment.

| REFERENCE NUMERALS | |
|---|---|
| 1 | Pre-preg Sheet |
| 1a | Pre-preg Sheet |
| 1b | Pre-preg Sheet |
| 2a | Releasing Film |
| 2b | Releasing Film |
| 3 | Through-Hole |
| 4 | Conductive Paste |
| 5a | Metal Foil |
| 5b | Metal Foil |
| 6a | Circuit Pattern |
| 6b | Circuit Pattern |
| 6c | Circuit Pattern |
| 6d | Circuit Pattern |

DETAILED DESCRIPTION OF THE PREFERRED EMBODIMENT

FIG. 1A to FIG. 1G are sectional views of a double-sided circuit board for showing a method of manufacturing the board in accordance with an exemplary embodiment of the present invention.

Pre-preg sheet 1 is made of a composite material substrate 1a of a fiber sheet, such as non-woven fabric of aromatic polyamide fiber and thermosetting epoxy resin 1b impregnated into the non-woven fabric. The non-woven fabric has a size of 250 mm by 250 mm and has a thickness of about 110 μm. The epoxy resin has a softening temperature of 70° C. and a minimum melting viscosity of 1000 Pa·s. The composite material is heated and pressurized by hot press to have a thickness of about 100 μm, and the resin is at a B stage (semi-hard state).

Conductive paste 4 filling through-hole 8 is produced by sufficiently kneading three rolls of 85 wt. % of conductive filler, 12.5 wt. % of thermosetting epoxy resin having no solvent, and 2.5 wt. % of anhydride hardening agent.

The conductive filler is Cu powder having an average grain size of 2 μm, and may be powder of Au, Ag, or an alloy of them.

The viscosity of the thermosetting epoxy resin at softening and melting is the smallest at temperatures lower than 70° C.

The softening temperature of the thermosetting epoxy resin contained in conductive paste 4 is preferably lower than that of the thermosetting epoxy resin impregnated into pre-preg sheet 1.

Figure 2A:
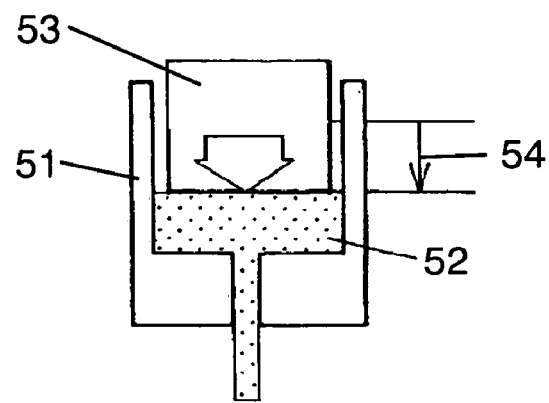
FIG. 2A shows a method of measuring a resin state of a pre-preg sheet in accordance with the exemplary embodiment.

As shown in FIG. 2A, resin 52 was put into cell 51. Resin 52 was heated while a pressure of 5 MPa was applied to resin 52 with piston 53. Displacement 54 of piston 53 provided when resin 52 was softened and flows due to the heating was measured.

Figure 2B:
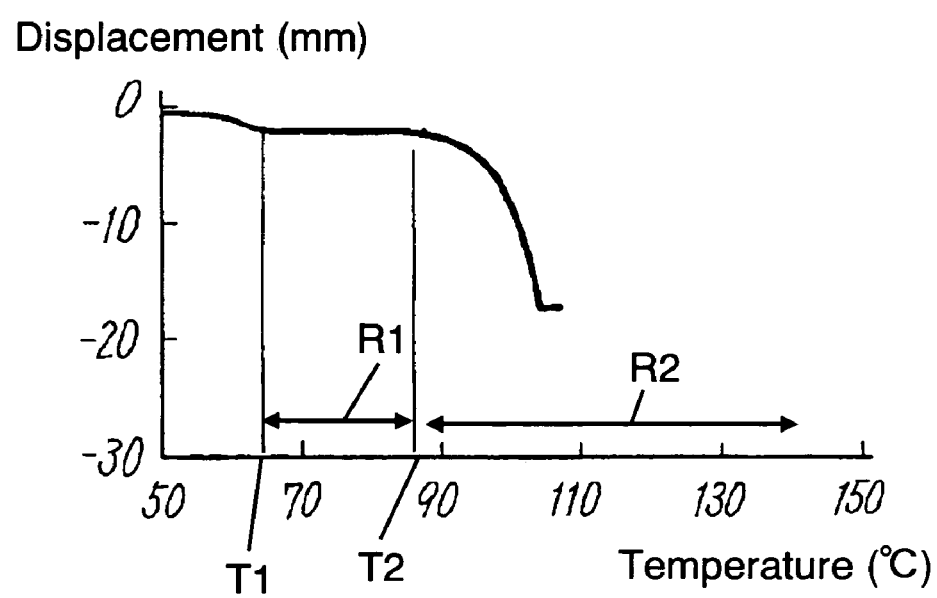
FIG. 2B shows the state of a resin in a pre-preg sheet in accordance with the embodiment.

FIG. 2B shows displacement 54 of piston 53. Temperature range R1 from softening temperature T1 (65° C.) to melting temperature T2 (85° C.) of resin 52 is a softening range of resin 52, and the resin is soft but hardly flows within this range. In this softening range, pre-preg sheet 1 is easily compressed, so that temperature range R1 is adequate for a compressing process. The temperature range from melting temperature T2 (85° C.) to 140° C. is flowing/hardening range R2 when resin 52 flows to proceed a hardening reaction. Since the resin flows, this temperature range is adequate for a molding process.

The method of manufacturing the circuit board in accordance with the embodiment will be described below. Processes shown in FIG. 1A to FIG. 1E are the same as conventional processes shown in FIG. 6A to FIG. 6E, respectively, and the descriptions of FIG. 1A to FIG. 1E are omitted.

COMPARATIVE EXAMPLE 1

Figure 6A:
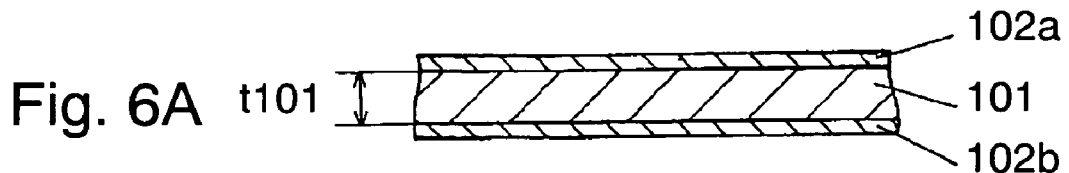
FIG. 6A is a sectional view of a double-sided circuit board for showing a conventional method of manufacturing the board.
Figure 6B:
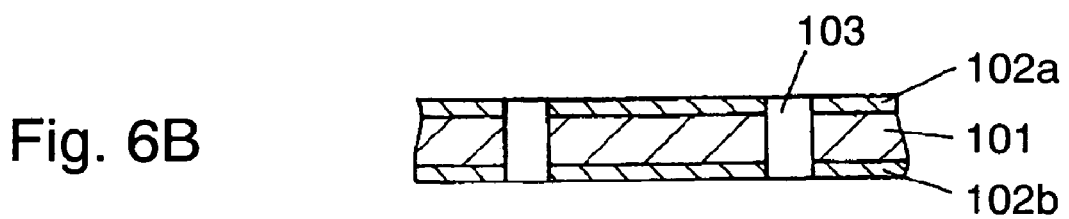
FIG. 6B is a sectional view of the double-sided circuit board for showing the conventional method of manufacturing the board.
Figure 6C:
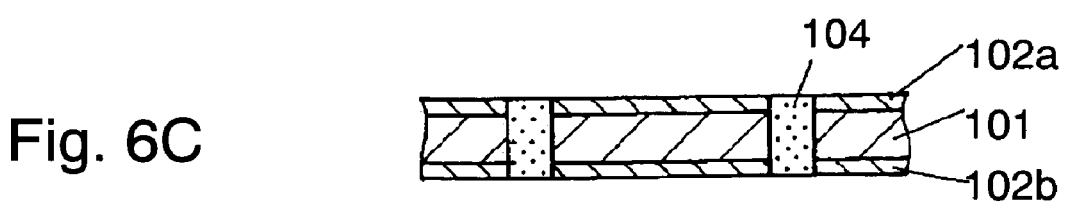
FIG. 6C is a sectional view of the double-sided circuit board for showing the conventional method of manufacturing the board.
Figure 6D:
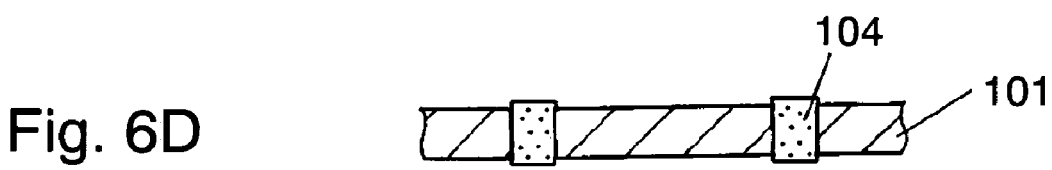
FIG. 6D is a sectional view of the double-sided circuit board for showing the conventional method of manufacturing the board.
Figure 6E:
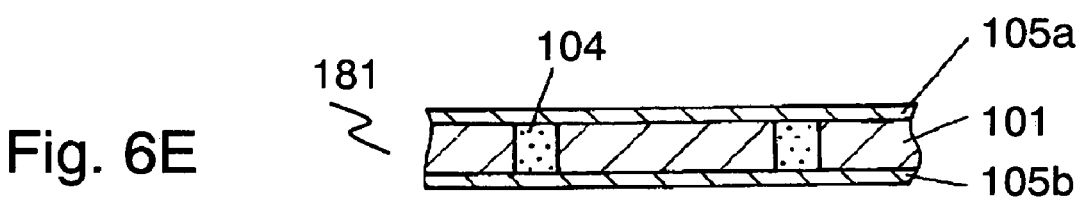
FIG. 6E is a sectional view of the double-sided circuit board for showing the conventional method of manufacturing the board.

As shown in FIG. 6E, copper foils 105a and 105b having thicknesses of 18 μm were placed on pre-preg sheet 101 at a room temperature to provide laminated body 181. Ten sets of laminated bodies 181 were installed on a stainless mirror plate having a thickness of about 1 mm over a setting plate.

Figure 3:
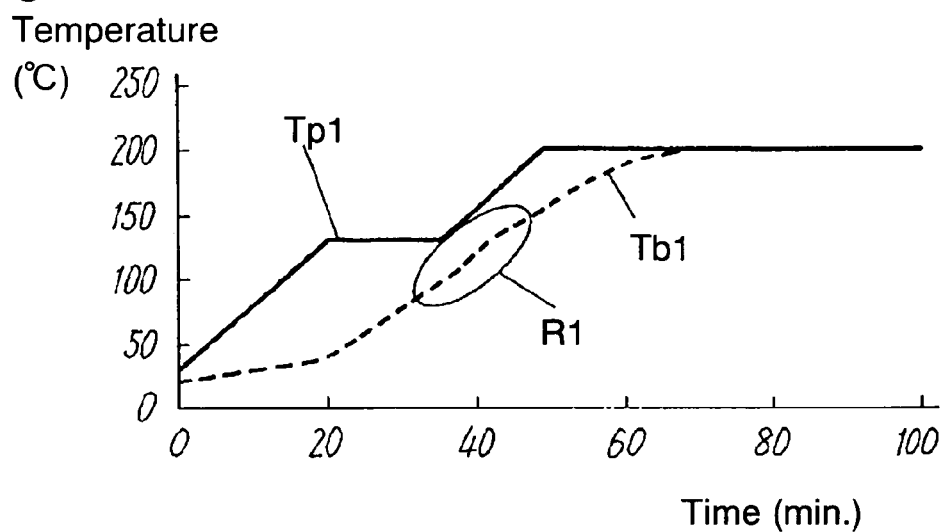
FIG. 3 shows a profile of the pre-preg sheet upon being compressed in accordance with the embodiment.
Figure 6F:
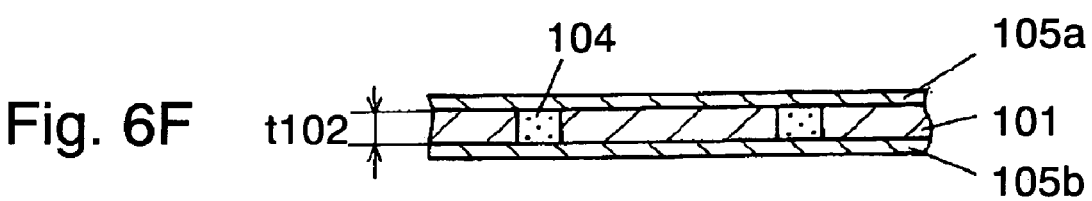
FIG. 6F is a sectional view of the double-sided circuit board for showing the conventional method of manufacturing the board.
Figure 6G:
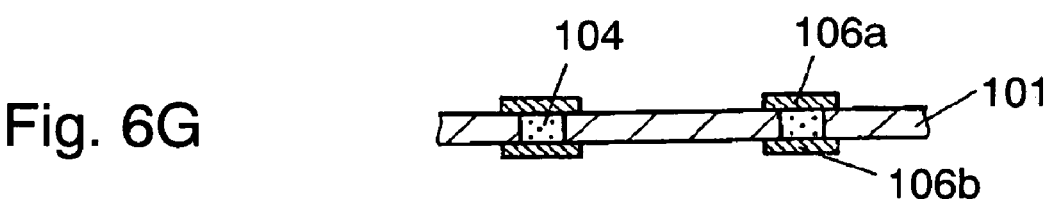
FIG. 6G is a sectional view of the double-sided circuit board for showing the conventional method of manufacturing the board.
Figure 7A:
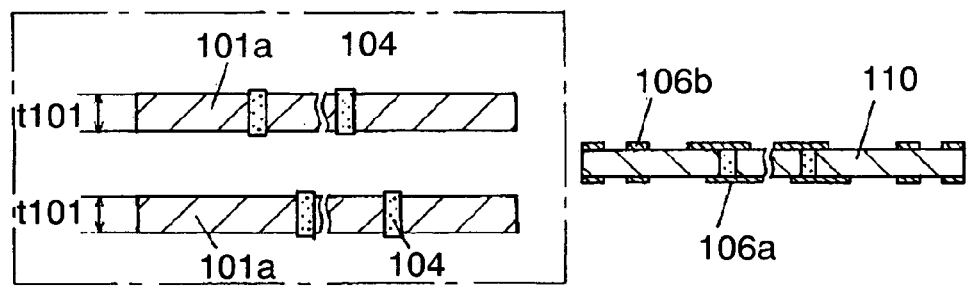
FIG. 7A is a sectional view of a four-layer circuit board for showing the conventional method of manufacturing the board.
Figure 7B:
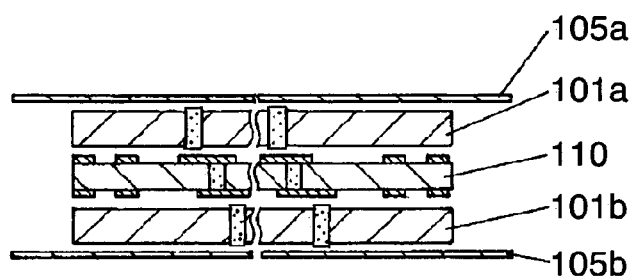
FIG. 7B is a sectional view of the four-layer circuit board for showing the conventional method of manufacturing the board.
Figure 7C:
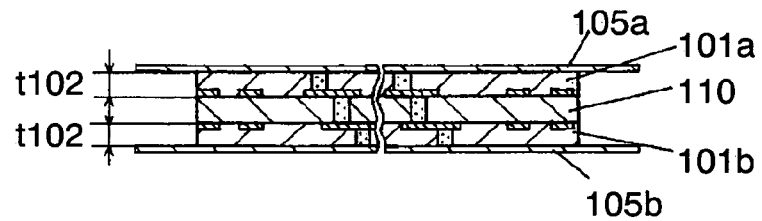
FIG. 7C is a sectional view of the four-layer circuit board for showing the conventional method of manufacturing the board.
Figure 7D:
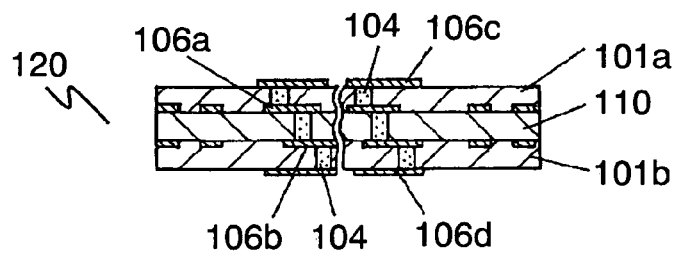
FIG. 7D is a sectional view of the four-layer circuit board for showing the conventional method of manufacturing the board.
Figure 8A:
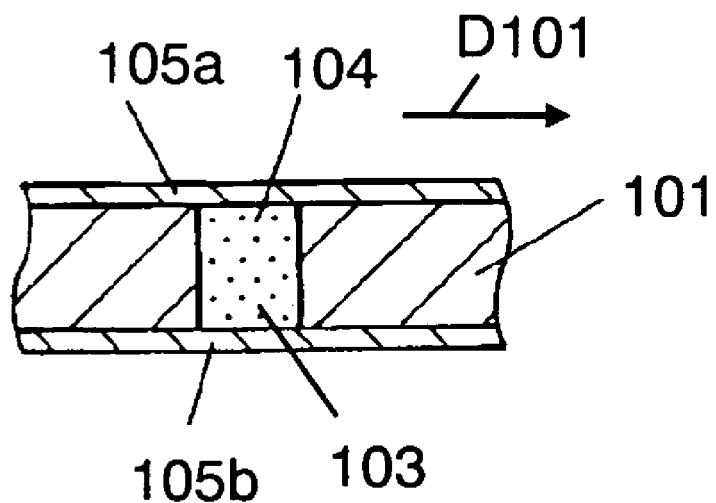
FIG. 8A is a sectional view of the circuit board manufactured by the conventional method.
Figure 8B:
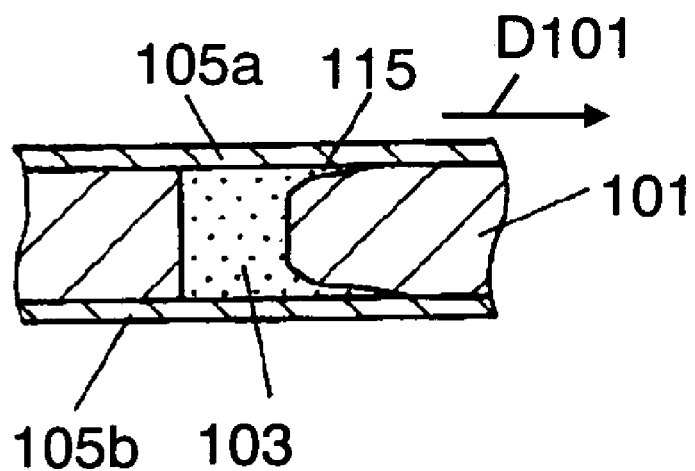
FIG. 8B is a sectional view of the circuit board manufactured by the conventional method.

As shown in FIG. 6F, laminated body 181 was then mounted on a vacuum hot pressing machine, heated, and pressurized. FIG. 3 shows temperature profile Tp1 and temperature Tb1 of the laminated body at this moment. A temperature-rising rate of the resin of laminated body 181 within flowing/hardening range R2 was determined to be 5° C./min., and laminated body 181 was pressurized at a pressure of 5 MPa in range R1 to be molded.

COMPARATIVE EXAMPLE 2

As shown in FIG. 6E, copper foils 105a and 105b having thicknesses of 18 μm were placed on pre-preg sheet 101 at a room temperature to provide laminated body 181. Ten sets of laminated bodies 181 were installed on a stainless mirror plate having a thickness of about 1 mm over a plate.

Figure 4:
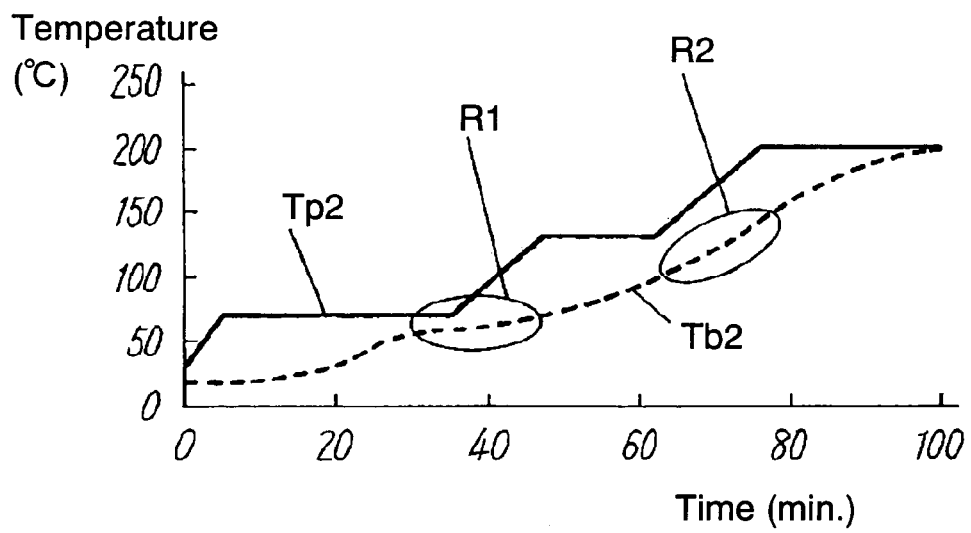
FIG. 4 shows another profile of the pre-preg sheet upon being compressed in accordance with the embodiment.

As shown in FIG. 6F, laminated body 181 was then mounted on a hot pressing machine, heated, and pressurized. FIG. 4 shows temperature profile Tp2 and temperature Tb2 of the laminated body at this moment. Laminated body 181 was pressurized at a pressure of 5 MPa in resin softening range R1 to be molded.

A temperature-rising rate of temperature profile Tp2 in flowing/hardening range R2 was 5° C./min., namely, the same as that of temperature profile Tp1 shown in FIG. 3, but the temperature-rising rate of temperature Tb2 of laminated body 181 was 3° C./min.

EXAMPLE 1

Figure 1E:
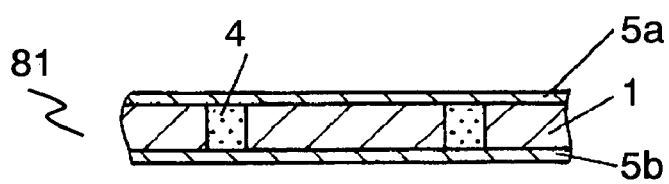
FIG. 1E is a sectional view of the double-sided circuit board for showing the method of manufacturing the board in accordance with the embodiment.

As shown in FIG. 1E, copper foils 5a and 5b having thicknesses of 18 μm were placed on pre-preg sheet 1 at a room temperature to provide laminated body 81. Ten sets of laminated bodies 81 were placed on a stainless mirror plate having a thickness of about 1 mm over a plate.

Laminated bodies 81 over the plate were put into a hot pressing machine, pressurized at a pressure of 5 MPa for 10 minutes, and then taken out. Here, the hot pressing machine was a heating/pressurizing device having a temperature maintained at 70° C.

Figure 1F:
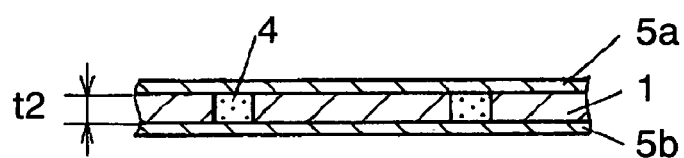
FIG. 1F is a sectional view of the double-sided circuit board for showing the method of manufacturing the board in accordance with the embodiment.
Figure 1G:
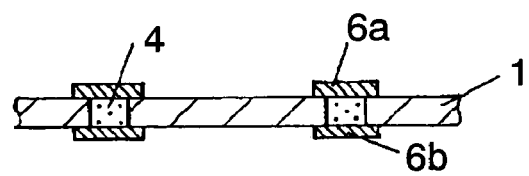
FIG. 1G is a sectional view of the double-sided circuit board for showing the method of manufacturing the board in accordance with the embodiment.

Next, as shown in FIG. 1F, laminated body 81 was heated according to temperature profile Tp1 shown in FIG. 3 by a vacuum hot pressing machine, pressurized at a pressure of 5 MPa within resin flowing/hardening range R2 to be molded.

Laminated body 81 may be heated at 80° C. by a dryer as the heating device and put into the vacuum hot pressing machine.

By this method, a predetermined temperature-rising rate of laminated body 81 was obtained by even if temperature rising delayed due to an intermediate material, such as the stainless plate, and the hot pressing machine as a heating/pressurizing device.

EXAMPLE 2

Figure 1H:
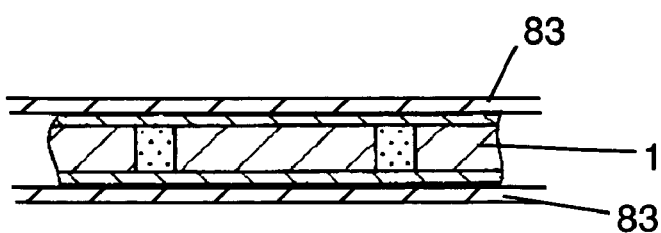
FIG. 1H is a sectional view of the double-sided circuit board for showing the method of manufacturing the board in accordance with the embodiment.

As shown in FIG. 1E, copper foils 105a and 105b having thicknesses of 18 μm were placed on pre-preg sheet 1 to provide laminated body 81. Then, as shown in FIG. 1H, each of 10 sets of laminated bodies 81 was sandwiched between stainless mirror plates 83 having thicknesses of about 1 mm, and was installed on a plate. Stainless mirror plates 83, a laminating device, were previously heated at 80° C. by a dryer.

Then, laminated body 81 was put into a vacuum hot pressing machine and heated according to temperature profile Tp1 shown in FIG. 3, and was pressurized at a pressure of 5 MPa within resin flowing/hardening range R2 to be molded.

By this method, a predetermined temperature-rising rate of in laminated bodies 81 was obtained even if the temperature rising was delayed due to the stainless plate as the heating device or an intermediate material.

EXAMPLE 3

As shown in FIG. 1E, copper foils 5a and 5b having thicknesses of 18 μm were placed on pre-preg sheet 1 at a room temperature to provide 10 sets of laminated bodies 81. Laminated body 81 was placed on a stainless mirror plate having a thickness of about 1 mm.

Figure 5:
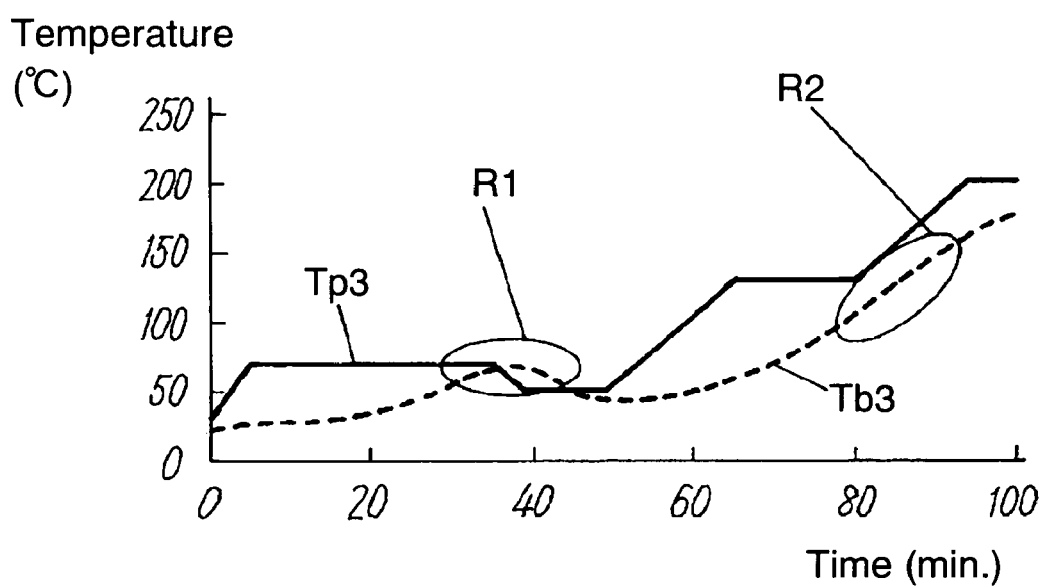
FIG. 5 shows a further profile of the pre-preg sheet upon being compressed in accordance with the embodiment.

Laminated body 81 was then put into a vacuum hot pressing machine, heated, and pressurized. FIG. 5 shows temperature profile Tp3 and temperature Tb3 of laminated body 81 at this moment. A temperature of laminated body 81 was maintained at 70° C. within resin softening range R1 for 10 minutes, compressed at 5 MPa, and then cooled to a temperature not higher than 50° C. The temperature-rising rate of temperature profile Tp3 in resin flowing/hardening range R2 was determined to be 5° C./min.

FIG. 3 to FIG. 5 show only temperature profiles Tp1, Tp2, and Tp3 and temperatures Tb1, Tb2 and Tb3 of laminated bodies 81 and 181, and exclude temperature profiles, pressure profiles, and vacuum pressures in the resin hardening range and during cooling. Within resin hardening range R2, the laminated bodies of all of comparative examples 1 and 2 and examples 1 to 3 were maintained at 200° C. for about 60 minutes to harden the resins, and then cooled.

During a process of compressing laminated bodies 81 and 181 of examples 1 to 3 and comparative example 2, the thermosetting epoxy resin in the conductive paste is softened, and has a viscosity reaching the smallest value. Thus, conductive paste 4 can deform by any pressure and be compressed slowly.

A contacting force between Cu particles in the conductive paste can increase when the thermosetting epoxy resin (including no solvent) diffuses from through-hole 3 to the copper foils.

After laminated bodies 81 and 181 of examples 1 to 3 and comparative example 2 were compressed, copper foils 5a, 5b, 105a and 105b were peeled off for observation of pre-preg sheets 1 and 101. It was confirmed that resins in conductive pastes 4 and 104 diffuse in copper foils 5a, 5b, 105a, and 105b, and that pre-preg sheets 1 and 101 were slightly molded to have thicknesses reduced.

The resistances of conductive pastes 4 and 104 in through-holes 3 and 103 in the double-sided circuit boards (FIG. 1G) and the four-layer circuit boards manufactured by the methods of examples 1 to 3 and comparative example 2 are about 20% smaller than that of the circuit board of comparative example 1. Comparative example 2, however, exhibited the temperature-rising rate in the molding process was small, and the resin does not sufficiently flow, and a whitening phenomenon, a molding failure, of pre-preg sheet 101 was confirmed.

According to observation of peripheries of through-holes 3 of the circuit boards of examples 1 to 3, no outflow of conductive paste 4 was confirmed visually.

In the boards of examples 1 to 3, the resistance of conductive paste 4 filling through-holes 3 is stable even in pre-preg sheet 1 to be compressed at a small rate, hence providing a circuit board having a high quality. According to this embodiment, the board may be molded after the lamination and the compression are executed simultaneously, thus providing similar effects. Thus, the limitations to molding facilities having different capacity or function and melting characteristics of the press intermediate material and the pre-preg sheet can be removed.

Therefore, a temperature profile corresponding to compression executed under a non-continuous heating raising a temperature may be incorporated into a general pressing profile in the molding process, thus providing similar effects and increasing productivity.

Laminated body 81 is mounted in a heating device, such as a furnace, or in a heating/pressurizing device hot pressing, and is heated. Laminated body 81 is formed using a laminated device which is heated. At least one of the heating/pressurizing device and the laminating device can be used according to a capacity of a productive facility or a capacity of providing laminated body 81, thereby improving the productivity and stabilizing the quality.

According to this embodiment, pre-preg sheet 1 is made of a composite material including a non-woven fabric made of aromatic polyamide fiber and a thermosetting epoxy resin impregnated in the fabric. However, pre-preg sheet 1 at a B-stage may be manufactured by impregnating a substrate made of woven fabric as a fiber sheet with a resin material mainly containing thermosetting resin.

Pre-preg sheet 1 may be at a B-stage where a fiber sheet of woven fabric or non-woven fabric of glass fiber is impregnated with a resin material mainly containing thermosetting resin. In particular, pre-preg sheet 1 to be compressed at a small rate as shown in FIG. 1F has a larger effect. When pre-preg sheet 1 at the B-stage including fabric mainly made of glass fiber and thermosetting resin impregnated in the fabric is compressed at a small rate smaller than, e.g., 10%, the resistance of conductive paste 4 in through-holes 3 is about 30% smaller than that of the comparative examples. The four-layer circuit board is explained as the multi-layer circuit board according to the embodiment. However, a multi-layer circuit board having more than four layers provides similar effects. Thus, the present invention is not limited to the material and condition of each examples. The laminating process, compressing process, and molding process according to the embodiment provides similar effects.

The limitations to the molding facility and the melting characteristics of the intermediate material for pressing and the pre-preg sheet can be removed. The present embodiment is effective especially for pre-preg sheet 1 having through-holes 3 filled with conductive paste 4, and the viscosity of the resin for securing conduction may not necessarily be adjusted precisely.

The laminating process and compressing process may be simultaneously executed and the molding process may then be executed, thus providing similar effects. The temperature profile corresponding to the compressing process may be independently incorporated into a general press profile in the molding process, which provides similar effects.

According to the embodiment, the compressing process of heating and pressurizing the pre-preg sheet for a predetermined time at a predetermined pressure at a temperature close to the softening temperature of the impregnated resin is executed before the molding process. Thus, adhesiveness and flatness of different kinds of materials, such as the pre-preg sheet and the conductive circuit pattern placed on the metal foils or the circuit board, can be improved. Since the outflow of the conductive paste during the melting of the resin of the pre-preg sheet is reduced by lowering the temperature to not higher than the softening temperature of the resin, the connection resistance is stable.

Since pre-preg sheet 1 is heated, pressurized, and compressed for the predetermined time at the predetermined pressure at the temperature close to the softening temperature of the impregnated resin before the molding, the adhesive force of different kinds of materials, such as the pre-preg sheet and the conductive circuit pattern placed on the metal foils or the circuit board can be improved, and the board can be flattened.

Upon pre-preg sheet 1 being compressed before the molding, only conductive paste 4 is first pressurized selectively and contacts metal foils 5a and 5b securely, and the resin of conductive paste 4 diffuses on surfaces of metal foils 5a and 5b to increase the contacting force between conductive particles of conductive paste 4. This prevents the outflow of conductive paste 4 due to the melting of the resin of pre-preg sheet 1, and stabilizes the resistance of conductive paste 4.

The softening temperature of the thermosetting resin in conductive paste 4 may be lower than that of the resin in pre-preg sheet 1. A range allowing the viscosity of the melting resin in pre-preg sheet 1 to be large, namely, a range in which the resin is soft but hardly flows is provided. Pre-preg sheet 1 can be easily compressed, and the contacting force between the conductive particles of conductive paste 4 can be increased. Further, deformation of pre-preg sheet 1 due to the melting of the resin in pre-preg sheet 1 is reduced, thereby reducing resin flow and preventing the outflow of conductive paste 4.

The softening of the resin in conductive paste 4 is facilitated, and the viscosity of conductive paste 4 is close to the smallest, the resin in conductive paste 4 easily diffuses on the surface of metal foils 5a and 5b, and the contacting force between the conductive particles of conductive paste 4 can be increased.

Pre-preg sheet 1 is in the B-stage, thereby increasing the adhesive force against metal foils 5a and 5b.

The substrate of pre-preg sheet 1 may employ a non-woven fabric made of aromatic polyamide fiber, thereby increasing a mechanical strength of the circuit board and reducing the weight of the circuit board. This allows through-hole 3 to have a small diameter, and stabilizes the resistance of conductive paste 4 filling through-hole 3, thus providing a the high-quality circuit board.

The substrate of pre-preg sheet 1 may employ woven fabric or non-woven fabric of glass fiber. This material increases a mechanical and physicochemical strength of the circuit board, and stabilizes the resistance of the conductive paste filling through-hole 3 in pre-preg sheet 1 especially when the sheet is compressed at a small rate in its thickness direction, providing a high-quality circuit board.

Pre-preg sheet 1 is heated and pressurized for a predetermined time at a predetermined pressure at a heating temperature close to the softening temperature of resin 1b impregnated into pre-preg sheet 1, preventing the resin of pre-preg sheet 1 from flowing. This effect is remarkable especially for pre-preg sheet 1 including substrate 1a of woven fabric or non-woven fabric of glass fiber to be compressed at a relatively small compression rate not higher than 10%.

Pre-preg sheet 1 is compressed at a temperature close to the softening temperature of resin 1b impregnated into pre-preg sheet 1, and than, laminated body 81 is molded at a temperature higher than this temperature. This operation increases an adhesive force between the layers and stabilizes the resistance of the conductive paste, thus providing a high-quality circuit board.

When laminated body 81 is heated at a temperature close to the softening temperature of resin 1b impregnated into pre-preg sheet 1 and then heated at a temperature higher than this temperature, namely a temperature in the resin flowing/hardening range, the adhesive force between the layers can be improved.

Laminated body 81 is heated at a temperature close to the softening temperature of resin 1b impregnated into pre-preg sheet 1, is then heated to a temperature higher than this temperature, namely a temperature in the resin flowing/hardening range, and is further heated to a hardening temperature of resin 1b higher than the temperature in the resin flowing/hardening range, thereby increasing the adhesive force between the layers, stabilizing the resistance of the conductive paste, and providing a high-quality circuit board.

Resin 1b impregnated into pre-preg sheet 1 having a softening range in the temperature range from 50° C. to 130° C. is soft but hardly flows within a temperature range from 65° C. to 85° C., and flows and starts being hardened within a temperature range from 85° C. to 140° C. This resin enables pre-preg sheet 1 to be easily compressed and molded and provides sheet 1 including the resin flowing easily. This resin stabilizes the resistance of conductive paste 4 filling through-hole 3 in pre-preg sheet 1 compressed at a small compression rate, providing a high-quality circuit board.

When laminated body 81 is temporarily taken out of the heating device or the heating/pressurizing device, laminated body 81 may be cooled to have a temperature not higher than the softening temperature of resin 1b. Then, the adhesive force between different kinds of materials, such as pre-preg sheet 1 and circuit patterns 6a and 6b on copper foils 5a and 5b or the circuit board can be increased, and the circuit board can be flattened. Laminated body 81 is cooled to a temperature not higher than the softening temperature of resin 1b, thereby preventing the outflow of conductive paste 4 during the melting of the resin of pre-preg sheet 1 and stabilizing the resistance of the conductive paste.

Laminated body 81 is heated by the heating device, such as a furnace, and then, taken out to have its temperature decreased, thus improving a quality and productivity.

INDUSTRIAL APPLICABILITY

In a circuit board manufactured by a method according to the present invention, the resistance of a conductive paste filling a through-hole is stable even in a pre-preg sheet compressed at a small compression rate.

The invention claimed is:

1. A method of manufacturing a circuit board, comprising:
   preparing a pre-preg sheet including a substrate and a resin impregnated in the substrate, the pre-preg sheet having a first surface and a second surface opposite to the first surface;
   placing a first metal foil on the first surface of the pre-preg sheet to provide a laminated body;
   compressing the laminated body at a temperature close to a softening temperature of the resin at a predetermined pressure;
   cooling the laminated body to have a temperature not higher than the softening temperature of the resin after said compressing the laminated body at the predetermined pressure; and
   bonding the first metal foil to the pre-preg sheet of the laminated body and hardening the resin.

2. The method according to claim 1, wherein said compressing the laminated body at the predetermined pressure comprises compressing the pre-preg sheet at a compression rate smaller than 10%.

3. The method according to claim 1, wherein said placing the first metal foil on the first surface of the pre-preg sheet to provide the laminated body further comprised placing a second metal foil on the second surface of the pre-preg sheet to provide the laminated body.

4. The method according to claim 1, further comprising:
   forming a through-hole which penetrates the pre-preg sheet from the first surface to the second surface of the pre-preg sheet; and
   filling the through-hole with a conductive paste.

5. The method according to claim 1, wherein the pre-preg sheet is in a B-stage and is compressive.

6. The method according to claim 1, wherein the substrate of the pre-preg sheet comprises a non-woven fabric of aromatic polyamide fiber.

7. The method according to claim 1, wherein the substrate of the pre-preg sheet comprises a glass fiber.

8. The method according to claim 1, wherein said compressing of the laminated body at a temperature close to a softening temperature of the resin comprises compressing the laminated body at a first temperature, the first temperature being close to the softening temperature of the resin, and wherein said bonding the first metal foil to the pre-preg sheet of the laminated body and hardening the resin further comprising:
   heating the laminated body at a second temperature, the second temperature being higher than the first temperature; and
   heating the laminated body at a third temperature after said heating the laminated body at the second temperature, the third temperature being higher than the second temperature.

9. The method according to claim 1, wherein the resin of the pre-preg sheet has a softening range from 50° C. to 130° C.

10. The method according to claim 4, wherein the conductive paste includes a conductive filler and a thermosetting resin, and wherein a softening temperature of the thermosetting resin is lower than the softening temperature of the resin of the pre-preg sheet.

11. The method according to claim 8, wherein the second temperature is within a flowing/hardening range of the resin.

12. The method according to claim 8, wherein the third temperature is a hardening temperature of the resin.

13. The method according to claim 4, wherein the resin comprises a thermosetting resin.

14. The method according to claim 1, wherein said bonding the first metal foil to the pre-preg sheet of the laminated body and hardening the resin comprises:
   bonding the first metal foil to the pre-preg sheet; and
   hardening the resin after said cooling of the laminated body.

15. The method according to claim 14, wherein said bonding of the first metal foil to the pre-preg sheet comprises bonding the first metal foil to the laminated body of the pre-preg sheet between said compressing of the laminated body and said cooling of the laminated body.

* * * * *

UNITED STATES PATENT AND TRADEMARK OFFICE
CERTIFICATE OF CORRECTION

PATENT NO. : 7,281,325 B2 Page 1 of 1
APPLICATION NO. : 10/535158
DATED : October 16, 2007
INVENTOR(S) : Yoshihiro Kawakita et al.

It is certified that error appears in the above-identified patent and that said Letters Patent is hereby corrected as shown below:

In column 11, claim 8, line 13, "comprising" should be --comprises--.

Signed and Sealed this

Twenty-fifth Day of March, 2008

JON W. DUDAS
*Director of the United States Patent and Trademark Office*